United States Patent
Hinode et al.

(10) Patent No.: US 12,387,952 B2
(45) Date of Patent: Aug. 12, 2025

(54) SUBSTRATE PROCESSING METHOD INCLUDING THICKNESS MONITORING

(71) Applicant: SCREEN Holdings Co., Ltd., Kyoto (JP)

(72) Inventors: Taiki Hinode, Kyoto (JP); Takashi Ota, Kyoto (JP); Takao Itahara, Kyoto (JP); Kyohei Nakanishi, Kyoto (JP); Tatsuya Shimano, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 737 days.

(21) Appl. No.: 17/770,653

(22) PCT Filed: Oct. 15, 2020

(86) PCT No.: PCT/JP2020/038918
§ 371 (c)(1),
(2) Date: Apr. 21, 2022

(87) PCT Pub. No.: WO2021/085160
PCT Pub. Date: May 6, 2021

(65) Prior Publication Data
US 2022/0367218 A1    Nov. 17, 2022

(30) Foreign Application Priority Data
Oct. 30, 2019   (JP) ................. 2019-197336

(51) Int. Cl.
*H01L 21/306* (2006.01)
*G01B 11/06* (2006.01)
(Continued)

(52) U.S. Cl.
CPC ........ *H01L 21/67253* (2013.01); *G01B 11/06* (2013.01); *H01L 21/30604* (2013.01);
(Continued)

(58) Field of Classification Search
CPC .......... H01L 21/67253; H01L 21/6708; H01L 21/30604
See application file for complete search history.

(56) References Cited

U.S. PATENT DOCUMENTS 9,698,062 B2 *  7/2017  Mauer ................ H01L 21/6708
10,014,245 B2 *  7/2018  Seddon ............ H01L 21/02035
(Continued)

FOREIGN PATENT DOCUMENTS

| CN | 101523565 A | 9/2009 |
| CN | 205465666 U | 8/2016 |

(Continued)

OTHER PUBLICATIONS

Qin Zhao, et al., "PIV Measurement and CFD Simulation of Flow Characteristic in a Spinning Disc Reactor," Chemical Engineering (China), vol. 47, No. 5, May 2019. English translation of Abstract.
(Continued)

*Primary Examiner* — Daniel Luke
(74) *Attorney, Agent, or Firm* — OSTROLENK FABER LLP

(57) ABSTRACT

The substrate has a plurality of chip regions each being provided with a structure to be a power device, and is provided with a to-be-processed film. The thickness profile of the to-be-processed film in the radial direction is measured by scanning with the sensor in the radial direction while the substrate is rotated. The average thickness of the thickness profile is calculated. At least one radial position where the thickness profile has an average thickness is extracted as at least one candidate position. At least one of the at least one candidate position is determined to be at least one measurement position. Processing liquid is supplied from a nozzle onto the to-be-processed film of the substrate while the substrate is rotated. The sensor monitors the time-dependent change in the thickness of the to-be-pro-
(Continued)

cessed film in at least one measurement position while the substrate is rotated.

19 Claims, 14 Drawing Sheets

(51) Int. Cl.
  *H01L 21/67* (2006.01)
  *H01L 21/687* (2006.01)

(52) U.S. Cl.
  CPC .... *H01L 21/6708* (2013.01); *H01L 21/68764* (2013.01); *H01L 21/67051* (2013.01)

(56) References Cited

U.S. PATENT DOCUMENTS

| | | | |
|---|---|---|---|
| 10,186,461 B2* | 1/2019 | Tanaka | H01L 22/12 |
| 2005/0245169 A1 | 11/2005 | Morisawa et al. | |
| 2009/0149115 A1 | 6/2009 | Palou-Rivera et al. | |
| 2009/0227047 A1 | 9/2009 | Yang et al. | |
| 2010/0015889 A1 | 1/2010 | Shimizu et al. | |

FOREIGN PATENT DOCUMENTS

| | | |
|---|---|---|
| JP | 2003-097919 A | 4/2003 |
| JP | 2003-203897 A | 7/2003 |
| JP | 2003-207315 A | 7/2003 |
| JP | 2009-076922 A | 4/2009 |
| JP | 2012-004294 A | 1/2012 |
| JP | 2015-153989 A | 8/2015 |
| JP | 2016-016457 A | 2/2016 |
| JP | 2017-188549 A | 10/2017 |
| JP | 2017-204609 A | 11/2017 |
| KR | 10-1655070 B1 | 9/2016 |
| WO | WO 2004/003986 A1 | 1/2004 |

OTHER PUBLICATIONS

International Search Report mailed Dec. 28, 2020 in corresponding PCT International Application No. PCT/JP2020/038918.

Written Opinion mailed Dec. 28, 2020 in corresponding PCT International Application No. PCT/JP2020/038918.

First Office Action with Search Report dated Aug. 28, 2024 in corresponding Chinese Patent Application No. 202080074806.9 and an English language computer generated translation made from the Japanese translation of the original communication.

* cited by examiner

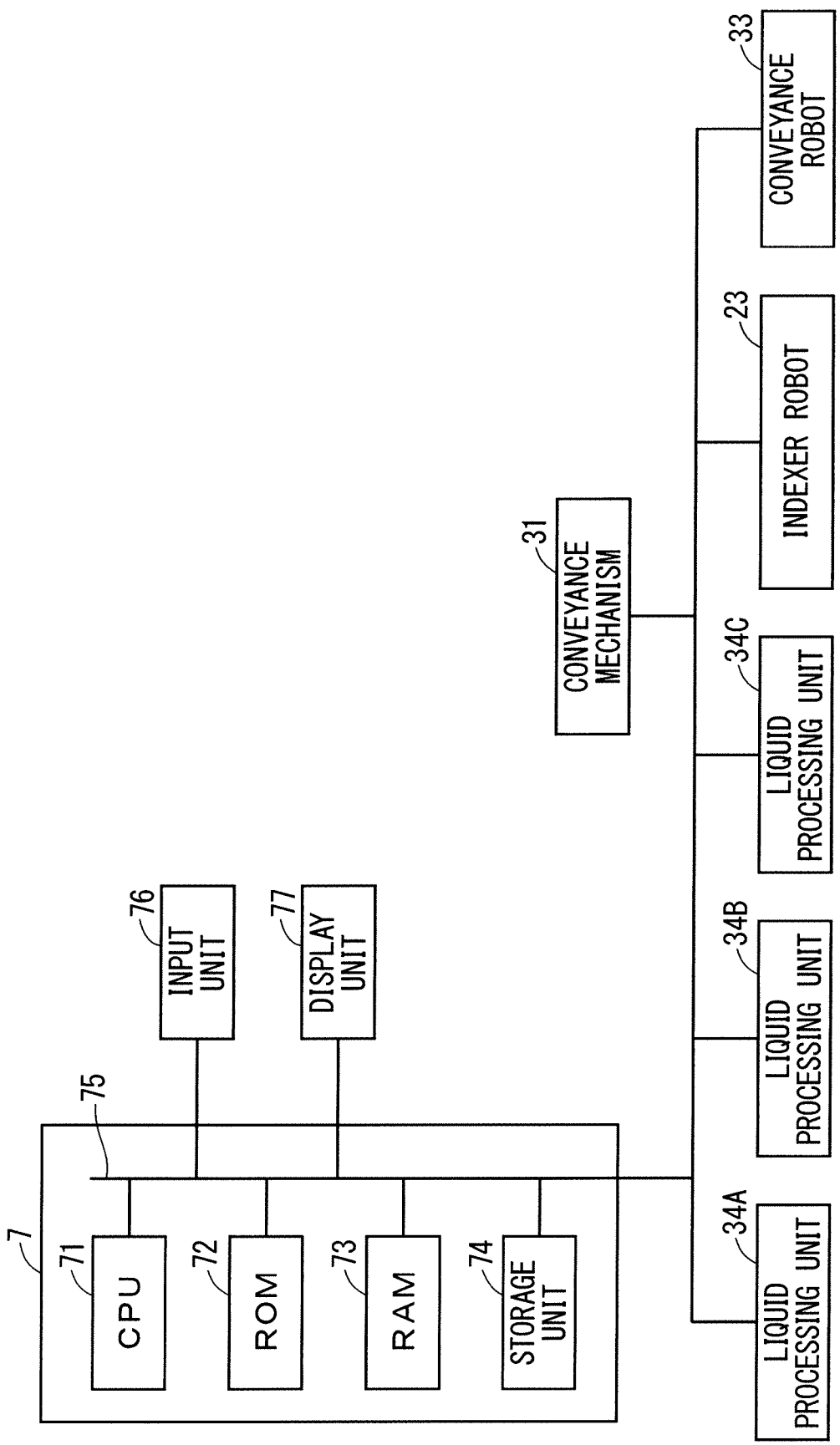
F I G. 4

F I G. 1 2
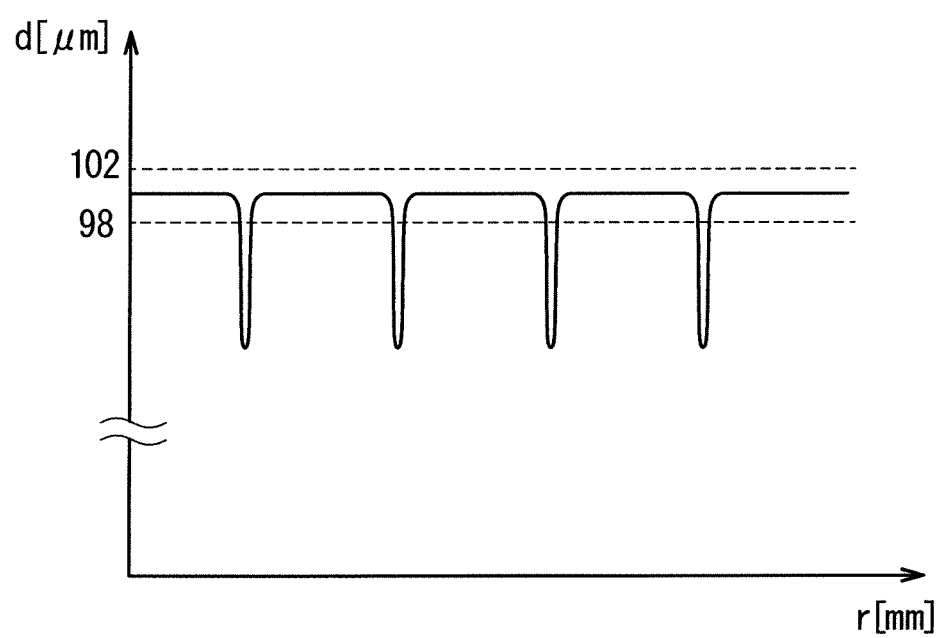

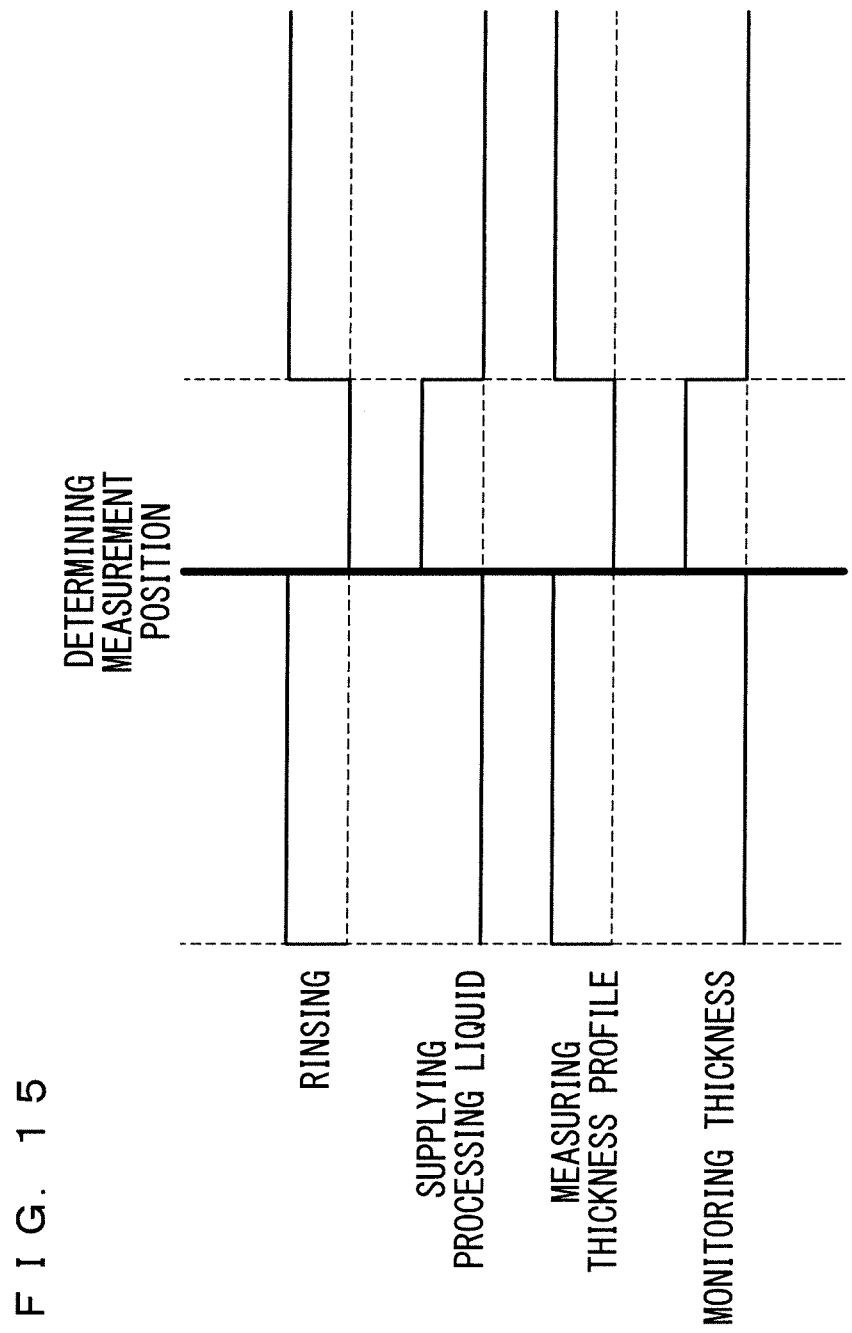

SUBSTRATE PROCESSING METHOD INCLUDING THICKNESS MONITORING

CROSS-REFERENCE TO RELATED APPLICATIONS

The present application is a 35 U.S.C. §§ 371 national phase conversion of International Application No. PCT/JP2020/038918, filed Oct. 15, 2020, which claims priority to Japanese Patent Application No. 2019-197336, filed Oct. 30, 2019, the contents of both of which are incorporated herein by reference. The PCT International Application was published in the Japanese language.

TECHNICAL FIELD

The present invention relates to a substrate processing method, and particularly to a substrate processing method that uses processing liquid.

BACKGROUND ART

Conventionally, in a manufacturing process of a semiconductor substrate (which will be hereinafter simply referred to as a "substrate"), various processing is performed on the substrate using a substrate processing apparatus. For example, etching for removing a film formed on the upper surface of the substrate using processing liquid is performed. According to Japanese Patent Application Laid-Open No. 2003-97919 (Patent Document 1), in the process of supplying etching liquid to a surface of a wafer and etching a thin film on the surface to the middle of the film thickness, the film thickness of the thin film is detected in real time. Then, the etching is stopped when the film thickness detection value reaches the target film thickness. As a result, it is intended to leave a thin film controlled with high accuracy to have a target film thickness on the wafer surface.

PRIOR ART DOCUMENT

Patent Document

Patent Document 1: Japanese Patent Application Laid-Open No. 2003-97919

SUMMARY

Problems to be Solved by the Invention

Due to process variations and the like, the thickness of the to-be-processed film in the substrate processing is not the same at all positions on the substrate. Since the substrate processing described in the above publication does not take this point into consideration, the performance of a device manufactured by a manufacturing method including the substrate processing may be insufficient. From another point of view, the manufacturing yield of a semiconductor device having sufficient performance may be low.

The present invention has been made in view of the problems as described above, and an object thereof is to provide a substrate processing method suitable for manufacturing a semiconductor device having sufficient performance.

Means to Solve the Problem

A substrate processing method according to one aspect of the present invention is a substrate processing method for processing at least one substrate that has a radial direction, has a plurality of chip regions each being provided with a structure to be a power device, and is provided with a to-be-processed film, the substrate processing method including steps of:

(a) measuring a thickness profile of the to-be-processed film in the radial direction by scanning with a sensor in the radial direction while rotating the substrate;

(b) calculating an average thickness of the thickness profile;

(c) extracting at least one radial position at which the thickness profile has the average thickness, as at least one candidate position;

(d) determining at least one of the at least one candidate position as at least one measurement position;

(e) supplying processing liquid from a nozzle onto the to-be-processed film of the substrate while rotating the substrate; and (f) monitoring a time-dependent change in a thickness of the to-be-processed film at the at least one measurement position by the sensor while rotating the substrate.

A substrate processing method according to another aspect of the present invention is a substrate processing method for processing at least one substrate that has a plurality of chip regions each having a radial direction and provided with a structure to be a semiconductor device that is a non-power device and is provided with a to-be-processed film, the substrate processing method including steps of:

(a) measuring a thickness profile of the to-be-processed film in the radial direction by scanning with a sensor in the radial direction while rotating the substrate;

(b) calculating a minimum thickness of the thickness profile;

(c) extracting at least one radial position at which the thickness profile has the minimum thickness, as at least one candidate position;

(d) determining at least one of the at least one candidate position as at least one measurement position;

(e) supplying processing liquid from a nozzle onto the to-be-processed film of the substrate while rotating the substrate; and (f) monitoring a time-dependent change in a thickness of the to-be-processed film at the at least one measurement position by the sensor while rotating the substrate.

Effects of the Invention

According to a substrate processing method of the one aspect, the average thickness of the to-be-processed film can be controlled accurately. Accordingly, the thickness of the to-be-processed film can be made just enough. Therefore, in a power device having a current path along the thickness direction of the to-be-processed film, it is possible to avoid the electric resistance from becoming excessively large due to an excessively large thickness and to avoid shortage of the withstand voltage due to an excessively small thickness.

According to a substrate processing method of the another aspect, the minimum thickness of the to-be-processed film can be controlled accurately. Accordingly, the substrate processing can be prevented from progressing excessively. Therefore, it is possible to avoid a harmful effect on the characteristics of the semiconductor device due to an unintended erosion of the portion covered with the to-be-processed film.

Objects, features, aspects, and advantages associated with the technology disclosed herein will become more apparent from the following detailed description and the accompanying drawings.

BRIEF DESCRIPTION OF DRAWINGS

FIG. 4 is a functional block diagram illustrating an example of the connection relationship between each element of the substrate processing apparatus in FIG. 1 and a control unit.

FIG. 12 is a graph for explaining a modification of measurement of a thickness profile according to the first embodiment.

FIG. 15 is a sequence diagram illustrating a modification of FIG. 7.

DESCRIPTION OF EMBODIMENTS

Figure 1:
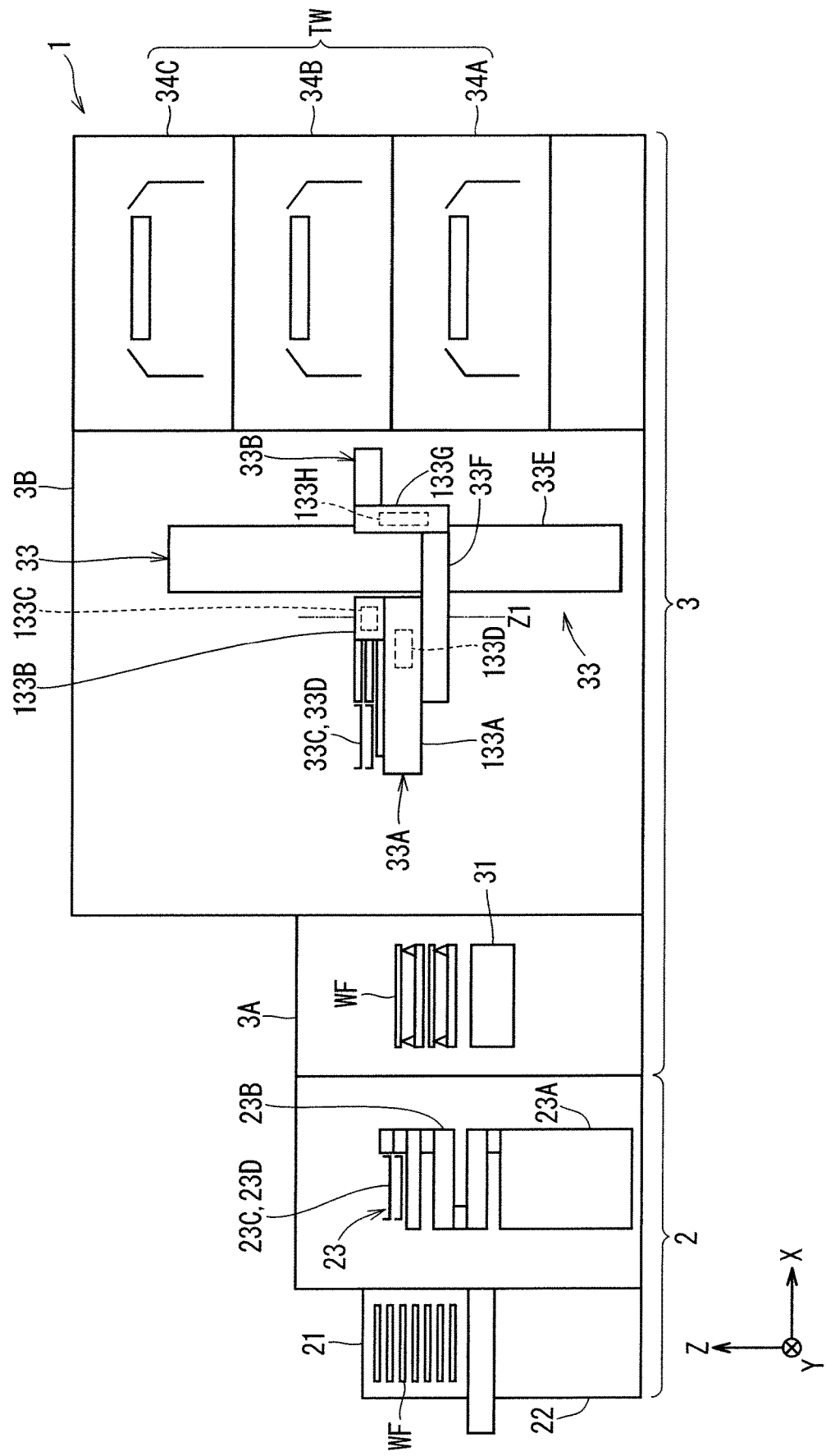
FIG. 1 is a diagram schematically illustrating an example of the configuration of a substrate processing apparatus according to a first embodiment.

Hereinafter, embodiments will be described with reference to the accompanying drawings. Although detailed features and the like are also illustrated in the following embodiments for the description of the technology, they are merely examples, and not all of them are necessarily essential features for carrying out the embodiments. Note that the drawings are illustrated schematically, and omission of the configuration or simplification of the configuration is appropriately made in the drawings for convenience of description. Moreover, the time width in the sequence diagram does not strictly indicate the actual time width. Moreover, the mutual relationship of sizes and positions of configurations and the like illustrated in different drawings is not necessarily described accurately, and can be appropriately changed. Moreover, in the following description, similar components are denoted by the same reference numerals, and names and functions thereof are also similar. Therefore, detailed description thereof may be omitted in order to avoid duplication. Moreover, when a certain component is described with "comprising", "including", "having", or the like in the following description, it is not an exclusive expression to exclude the presence of other components, unless otherwise specified. Moreover, an expression indicating a relative or absolute positional relationship, for example, "in one direction", "along one direction", "parallel", "orthogonal", "center", "concentric", "coaxial", or the like in the following description includes a case where the positional relationship is strictly indicated and a case where an angle or a distance is displaced within a tolerance or within a range in which a similar function is obtained, unless otherwise specified. Moreover, an expression indicating an equal state, for example, "same", "equal", "uniform", "homogeneous", or the like in the following description includes a case indicating a strictly equal state and a case where a difference occurs within a tolerance or within a range in which a similar function can be obtained, unless otherwise specified. Moreover, an expression such as "moving an object in a specific direction" in the following description includes a case of moving the object in parallel to the specific direction and a case of moving the object in a direction having a component in the specific direction, unless otherwise specified. Moreover, when it is described in the following description as "an upper surface of . . . ", "a lower surface of . . . ", or the like, it includes not only the upper surface itself of the target component but a state in which another component is formed on the upper surface of the target component. That is, for example, the description "Party B provided on the upper surface of Party A" does not preclude the presence of another component "Party C" between Party A and Party B. Moreover, an expression indicating a shape, for example, a "circular shape" or the like in the following description includes a case of strictly indicating the shape and a case where unevenness, chamfering, or the like is formed within a tolerance or within a range in which a similar function can be obtained, unless otherwise specified.

First Embodiment

FIG. 1 is a diagram schematically illustrating an example of the configuration of a substrate processing apparatus according to the present embodiment. Note that some components may be omitted or simplified in the drawings from the viewpoint of easy understanding of the configuration.

A substrate processing apparatus 1 is a single wafer type processing apparatus that processes disk-shaped substrates WF such as semiconductor wafers one by one. The substrate processing apparatus 1 performs various types of processing such as etching on the substrate WF. The substrate processing apparatus 1 includes an indexer section 2 and a processing section 3 in this order in the X-axis positive direction. Moreover, the processing section 3 includes a conveyance module 3A and a processing module 3B in this order in the X-axis positive direction.

The indexer section 2 includes a substrate container 21 capable of housing a plurality of substrates WF in a stacked state, a stage 22 that supports the substrate container 21, and an indexer robot 23 that receives an unprocessed substrate WF from the substrate container 21 and passes a substrate WF processed in the processing section 3 to the substrate container 21. Although the number of stages 22 is one in the example in FIG. 1 for the sake of simplicity, more stages may be arranged in the Y-axis direction. The substrate container 21 may be a front opening unified pod (FOUP) that houses the substrates WF in a sealed state, a standard mechanical inter face (SMIF) pod, an open cassette (OC), or the like. The indexer robot 23 includes, for example, a base portion 23A, an articulated arm 23B, and two hands 23C and 23D provided at an interval in the vertical direction. The base portion 23A is fixed to, for example, a frame that defines the outer shape of the indexer section 2 of the substrate processing apparatus 1. The articulated arm 23B is configured such that a plurality of arm portions rotatable along a horizontal plane are rotatably coupled to each other, and is configured such that the arm portion can be bent and stretched by changing an angle between arm portions at a joint that is a coupling portion of the arm portions. Moreover, the base end portion of the articulated arm 23B is coupled to the base portion 23A so as to be rotatable about a vertical axis. Moreover, the articulated arm 23B is coupled to the base portion 23A so as to be movable up and down. The hand 23C and the hand 23D are each configured to be able to hold one substrate WF. The indexer robot 23 conveys out one unprocessed substrate WF from the substrate container 21 held by the stage 22 using, for example, a hand 23C. Then, the indexer robot 23 passes the substrate WF to a conveyance mechanism 31 (described later) in the conveyance module 3A from the X-axis negative direction. Furthermore, the indexer robot 23 receives one processed substrate WF from the conveyance mechanism 31 using, for example, a hand 23D. Then, the indexer robot 23 houses the substrate WF in the substrate container 21 held by the stage 22.

The conveyance module 3A in the processing section 3 includes the conveyance mechanism 31 capable of conveying one or a plurality of substrates WF while holding the substrates WF in a horizontal posture. For example, the conveyance mechanism 31 may move on a cylindrical conveyance path surrounded by a partition wall (not shown here) formed along the XZ plane and the XY plane. Moreover, the conveyance mechanism 31 may be guided by a rail extending in the X-axis direction to reciprocate. The substrate WF is conveyed by the conveyance mechanism 31 between a position in the X-axis negative direction close to the indexer section 2 and a position in the X-axis positive direction close to a conveyance robot 33 (described later).

The processing module 3B in the processing section 3 includes a conveyance robot 33 that conveys a substrate WF, and a plurality of liquid processing units 34A, 34B, and 34C that perform substrate processing on an unprocessed substrate WF supplied from the conveyance mechanism 31. The conveyance robot 33 includes a horizontal drive unit 33A, a vertical drive unit 33B, a hand 33C, a hand 33D, and a column 33E that are attached to these components via a coupler 33F and extends in the vertical direction.

The horizontal drive unit 33A moves the hand 33C and the hand 33D in the horizontal direction. The horizontal drive unit 33A includes a stage 133A, a horizontal slider 133B that reciprocates in the horizontal direction on the upper surface of the stage 133A, and a horizontal motor 133C that moves the horizontal slider 133B. A linearly extending rail (not shown here) is provided on the upper surface of the stage 133A, and the moving direction of the horizontal slider 133B is regulated by the rail. The movement of the horizontal slider 133B is realized by a known mechanism such as a linear motor mechanism or a ball screw mechanism, for example. The hand 33C and the hand 33D are provided at a tip of the horizontal slider 133B. When the horizontal slider 133B is moved along the rail by the horizontal motor 133C, the hand 33C and the hand 33D can move forward and backward in the horizontal direction. In other words, the horizontal drive unit 33A moves the hand 33C and the hand 33D in a direction of horizontally receding from and approaching the column 33E. The horizontal drive unit 33A includes a rotation motor 133D that rotates the stage 133A about a rotation axis Z1 along the vertical direction. The hand 33C and the hand 33D can be rotated around the rotation axis Z1 by the rotation motor 133D within a range not interfering with the column 33E.

The vertical drive unit 33B includes a vertical slider 133G and a vertical motor 133H. The vertical slider 133G is engaged with a rail (not shown here) provided on the column 33E and extending in the vertical direction. The vertical motor 133H reciprocates the vertical slider 133G in the vertical direction along the rail. The movement of the vertical slider 133G is realized by a known mechanism such as a linear motor mechanism or a ball screw mechanism, for example.

The coupler 33F couples the vertical slider 133G with the stage 133A, and supports the stage 133A from below. As the vertical motor 133H moves the vertical slider 133G, the stage 133A moves in the vertical direction. As a result, the hand 33C and the hand 33D can move up and down in the vertical direction.

Note that it is not essential for the horizontal drive unit 33A to move the hand 33C and the hand 33D in parallel with the horizontal direction, and the hand 33C and the hand 33D may be moved in a combined direction of the horizontal direction and the vertical direction. That is, "moving in the horizontal direction" means moving in a direction having a horizontal component. Similarly, it is not essential for the vertical drive unit 33B to move the hand 33C and the hand 33D in parallel with the vertical direction, and the hand 33C and the hand 33D may be moved in a combined direction of the vertical direction and the horizontal direction. That is, "moving in the vertical direction" means moving in a direction having a vertical component.

The conveyance robot 33 conveys out one unprocessed substrate WF held by the conveyance mechanism 31 using, for example, the hand 33C. Then, for example, the conveyance robot 33 disposes the substrate WF on the upper surface of a spin base 51A (described later) in the liquid processing unit 34A from the X-axis negative direction.

Moreover, the conveyance robot 33 receives one processed substrate WF from the inside of the liquid processing unit 34A, the inside of the liquid processing unit 34B, or the inside of the liquid processing unit 34C using, for example, the hand 33D. Then, the conveyance robot 33 passes the substrate WF to the conveyance mechanism 31.

The liquid processing unit 34A, the liquid processing unit 34B, and the liquid processing unit 34C are stacked in this order in the Z-axis positive direction to constitute a processing tower TW. Although the number of liquid processing units is three in the example in FIG. 1 for the sake of simplicity, more than three may be provided. Moreover, although the liquid processing unit 34A, the liquid processing unit 34B, and the liquid processing unit 34C are illustrated in FIG. 1 to be positioned in the X-axis positive direction of the conveyance robot 33, the positions where the liquid processing unit 34A, the liquid processing unit 34B, and the liquid processing unit 34C are disposed are not limited to this case, and may be disposed in any of the X-axis positive direction, the Y-axis positive direction, and the Y-axis negative direction of the conveyance robot 33, for example.

Figure 2:
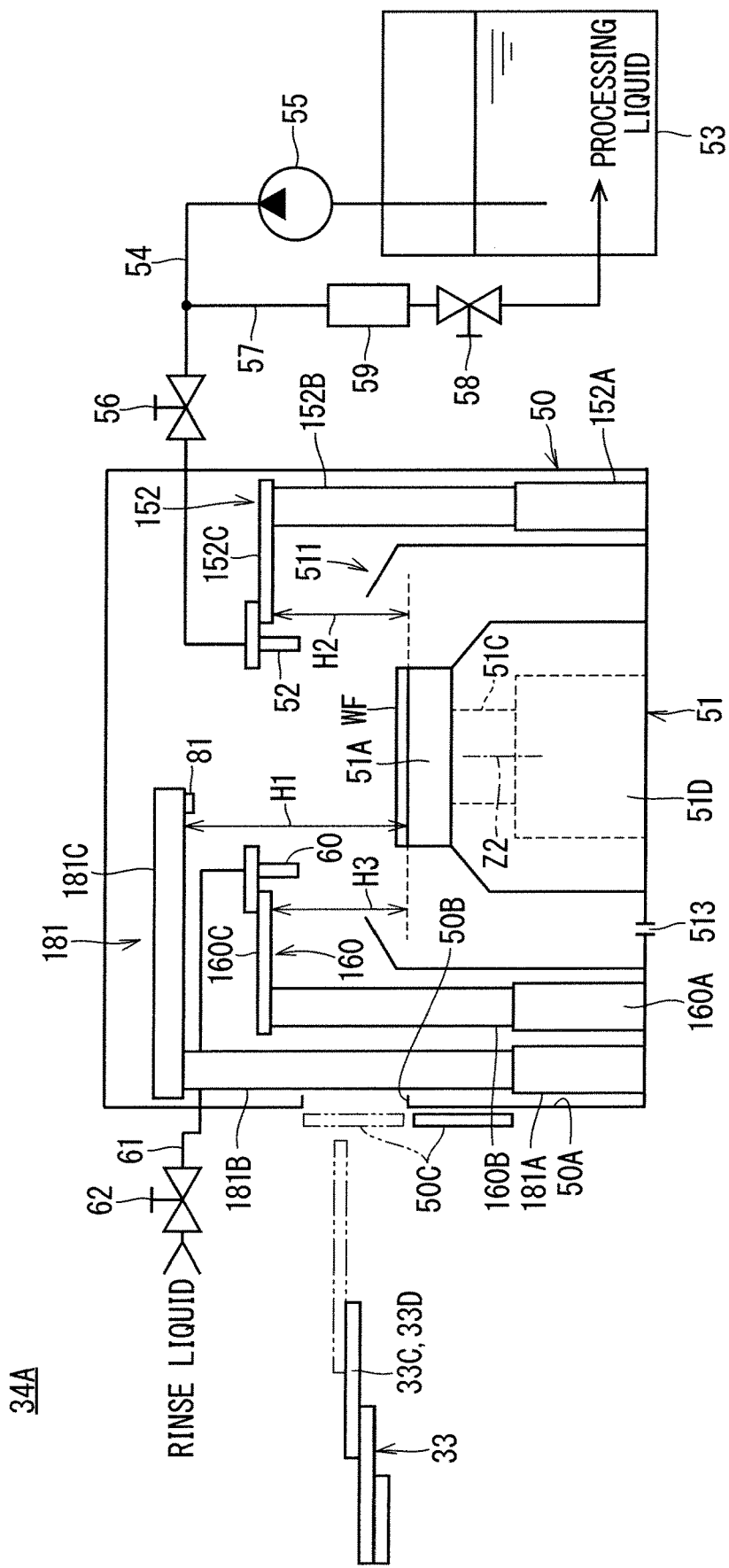
FIG. 2 is a diagram schematically illustrating an example of the configuration of a liquid processing unit in FIG. 1.

FIG. 2 is a diagram schematically illustrating an example of the configuration of the liquid processing unit 34A in the substrate processing apparatus according to the present embodiment. Note that the configurations of the liquid processing unit 34B and the liquid processing unit 34C are similar to those in the case illustrated in the example in FIG. 2. The liquid processing unit 34A includes a box-shaped processing chamber 50 having an internal space, a spin chuck 51 that rotates one substrate WF around a vertical rotation axis Z2 passing through a central portion of the substrate WF while holding the substrate WF in a horizontal posture in the processing chamber 50, and a cylindrical processing liquid recovery guard 511 surrounding the spin chuck 51 around the rotation axis Z2 of the substrate WF.

The processing chamber 50 is surrounded by a box-shaped partition wall 50A. An opening 50B for conveying the substrate WF into and out of the processing chamber 50 is formed in the partition wall 50A. The opening 50B is opened and closed by a shutter 50C. The shutter 50C is moved up and down between a closed position (indicated by two-dot chain lines in FIG. 2) at which the opening 50B is covered, and an open position (indicated by solid lines in FIG. 2) at which the opening 50B is opened by a shutter lifting mechanism (not shown here). When the substrate WF is conveyed in and out, the conveyance robot 33 causes the hands 33C and 33D to access the processing chamber 50 through the opening 50B. As a result, an unprocessed substrate WF can be disposed on the upper surface of the spin chuck 51, or a processed substrate WF can be removed from the spin chuck 51.

The spin chuck 51 includes the disk-shaped spin base 51A that vacuum-sucks the lower surface of the substrate WF in a horizontal posture, a rotating shaft 51C that extends downward from the central portion of the spin base 51A, and a spin motor 51D that rotates the substrate WF sucked to the spin base 51A by rotating the rotating shaft 51C. Note that the spin chuck 51 is not limited to a vacuum suction type chuck illustrated in the example in FIG. 2, and may be, for example, a holding type chuck that includes a plurality of chuck pins protruding upward from the outer peripheral portion of the upper surface of the spin base and holds the peripheral portion of the substrate WF with the chuck pins.

The liquid processing unit 34A includes a processing liquid nozzle 52 that discharges processing liquid toward the upper surface of the substrate WF held by the spin chuck 51, a processing liquid arm 152 having a tip attached to the processing liquid nozzle 52, a processing liquid tank 53 that stores the processing liquid to be supplied to the processing liquid nozzle 52, a processing liquid pipe 54 that guides the processing liquid in the processing liquid tank 53 to the processing liquid nozzle 52, a liquid feeder 55 (e.g., a pump) that feeds the processing liquid in the processing liquid tank 53 to the processing liquid pipe 54, and a processing liquid valve 56 that opens and closes the inside of the processing liquid pipe 54.

The processing liquid arm 152 includes a rotation drive source 152A, a shaft body 152B, and an arm portion 152C having one end fixed to an upper end of the shaft body 152B and the other end attached to the processing liquid nozzle 52. In the processing liquid arm 152, when the shaft body 152B is rotated by the rotation drive source 152A, the processing liquid nozzle 52 attached to the tip of the arm portion 152C can move along the upper surface of the substrate WF held by the spin chuck 51. That is, the processing liquid nozzle 52 attached to the tip of the arm portion 152C can move in the horizontal direction. Here, the driving of the rotation drive source 152A is controlled by a control unit to be described later.

Furthermore, the liquid processing unit 34A includes a circulation pipe 57 that connects the processing liquid pipe 54 and the processing liquid tank 53 on the upstream side (i.e., the processing liquid tank 53 side) of the processing liquid valve 56, a circulation valve 58 that opens and closes the inside of the circulation pipe 57, and a temperature adjustment apparatus 59 that adjusts the temperature of the processing liquid flowing through the circulation pipe 57. The opening and closing of the processing liquid valve 56 and the circulation valve 58 are controlled by a control unit to be described later. In a case where the processing liquid in the processing liquid tank 53 is supplied to the processing liquid nozzle 52, the processing liquid valve 56 is opened, and the circulation valve 58 is closed. In this state, the processing liquid sent from the processing liquid tank 53 to the processing liquid pipe 54 by the liquid feeder 55 is supplied to the processing liquid nozzle 52. On the other hand, in a case where the supply of the processing liquid to the processing liquid nozzle 52 is stopped, the processing liquid valve 56 is closed, and the circulation valve 58 is opened. In this state, the processing liquid sent from the processing liquid tank 53 to the processing liquid pipe 54 by the liquid feeder 55 returns into the processing liquid tank 53 through the circulation pipe 57. Therefore, during supply stop, that is, while the supply of the processing liquid to the processing liquid nozzle 52 is stopped, the processing liquid continues to circulate through a circulation path composed of the processing liquid tank 53, the processing liquid pipe 54, and the circulation pipe 57. The temperature adjustment apparatus 59 adjusts the temperature of the processing liquid flowing through the circulation pipe 57. Accordingly, the processing liquid in the processing liquid tank 53 is heated in the circulation path during the supply stop, and is maintained at a temperature higher than the room temperature.

Moreover, the liquid processing unit 34A includes a rinse liquid nozzle 60 that discharges rinse liquid toward the upper surface of the substrate WF held by the spin chuck 51, a rinse liquid arm 160 having a tip attached to the rinse liquid nozzle 60, a rinse liquid pipe 61 that supplies the rinse liquid from a rinse liquid supply source (not shown here) to the rinse liquid nozzle 60, and a rinse liquid valve 62 that switches supply and stop of the rinse liquid from the rinse liquid pipe 61 to the rinse liquid nozzle 60. As the rinse liquid, deionized water (DIW) or the like is used. The rinse liquid arm 160 includes a rotation drive source 160A, a shaft body 160B, and an arm portion 160C having one end fixed to the upper end of the shaft body 160B and the other end attached to the rinse liquid nozzle 60. In the rinse liquid arm 160, when the shaft body 160B is rotated by the rotation drive source 160A, the rinse liquid nozzle 60 attached to the tip of the arm portion 160C can move along the upper surface of the substrate WF held by the spin chuck 51. That is, the rinse liquid nozzle 60 attached to the tip of the arm portion 160C can move in the horizontal direction. Here, the driving of the rotation drive source 160A is controlled by a control unit to be described later. After the processing liquid is supplied to the substrate WF by the processing liquid nozzle 52, the rinse liquid is supplied from the rinse liquid nozzle 60 to the substrate WF, so that processing liquid adhering to the substrate WF can be washed away.

The processing liquid recovery guard 511 is provided so as to surround the periphery of the spin chuck 51. The processing liquid recovery guard 511 is preferably configured to be caused by a motor (not shown) to move up and down in the vertical direction. In this case, an upper portion of the processing liquid recovery guard 511 moves up and down between an upper position where the upper end thereof is above the substrate WF held by the spin base 51A, and a lower position where the upper end thereof is below the substrate WF. Processing liquid scattered outward from the upper surface of the substrate WF is received by the inner surface of the processing liquid recovery guard 511. Then, the processing liquid received by the processing liquid recovery guard 511 is appropriately discharged to the outside of the processing chamber 50 through a liquid discharge port 513 provided in a bottom portion of the processing chamber 50. At least a part of the processing liquid discharged from the liquid discharge port 513 is preferably reused. In other words, at least a part of the discharged processing liquid is preferably reused by being returned to the processing liquid tank 53.

Moreover, the liquid processing unit 34A includes a sensor 81 for measuring the film thickness of the film provided on the substrate WF, and a measurement arm 181 having a tip attached to the sensor 81.

As the sensor 81, an optical displacement sensor or the like is used, for example. The film thicknesses of various films (e.g., a silicon film) can be measured by adjusting the measured irradiation wavelength of light emitted from the sensor 81 to the facing substrate WF or the like at the time of measurement in accordance with a film to be measured (specifically, a to-be-processed film 501 to be described later with reference to FIG. 6).

The measurement arm 181 includes a rotation drive source 181A, a shaft body 181B, and an arm portion 181C having one end fixed to the upper end of the shaft body 181B and the other end attached to the sensor 81. When the shaft body 181B is rotated by the rotation drive source 181A, the sensor 81 attached to the tip of the arm portion 181C can move along the upper surface of the substrate WF held by the spin chuck 51. That is, the sensor 81 attached to the tip of the arm portion 181C can move in the horizontal direction. Here, the driving of the rotation drive source 181A is controlled by a control unit to be described later.

The measurement arm 181 is located at least farther from the upper surface of the substrate WF than the processing liquid arm 152 or the rinse liquid arm 160. That is, the height H1 of the measurement arm 181 in the vertical direction (the length from the upper surface of the spin base 51A to the arm portion 181C or the sensor 81) is larger than the height H2 of the processing liquid arm 152 in the vertical direction (the length from the upper surface of the spin base 51A to the arm portion 152C or the processing liquid nozzle 52) or the height H3 of the rinse liquid arm 160 in the vertical direction (the length from the upper surface of the spin base 51A to the arm portion 160C or the rinse liquid nozzle 60). As described above, since the measurement arm 181 is located far from the upper surface of the substrate WF, it is possible to suppress splashed liquid or the like from adhering to the sensor 81 when the processing liquid or the like is discharged onto the upper surface of the substrate WF. Note that the measurement arm 181 may be located farther from the upper surface of the spin base 51A than both the processing liquid arm 152 and the rinse liquid arm 160 as illustrated in the example in FIG. 2.

Figure 3:
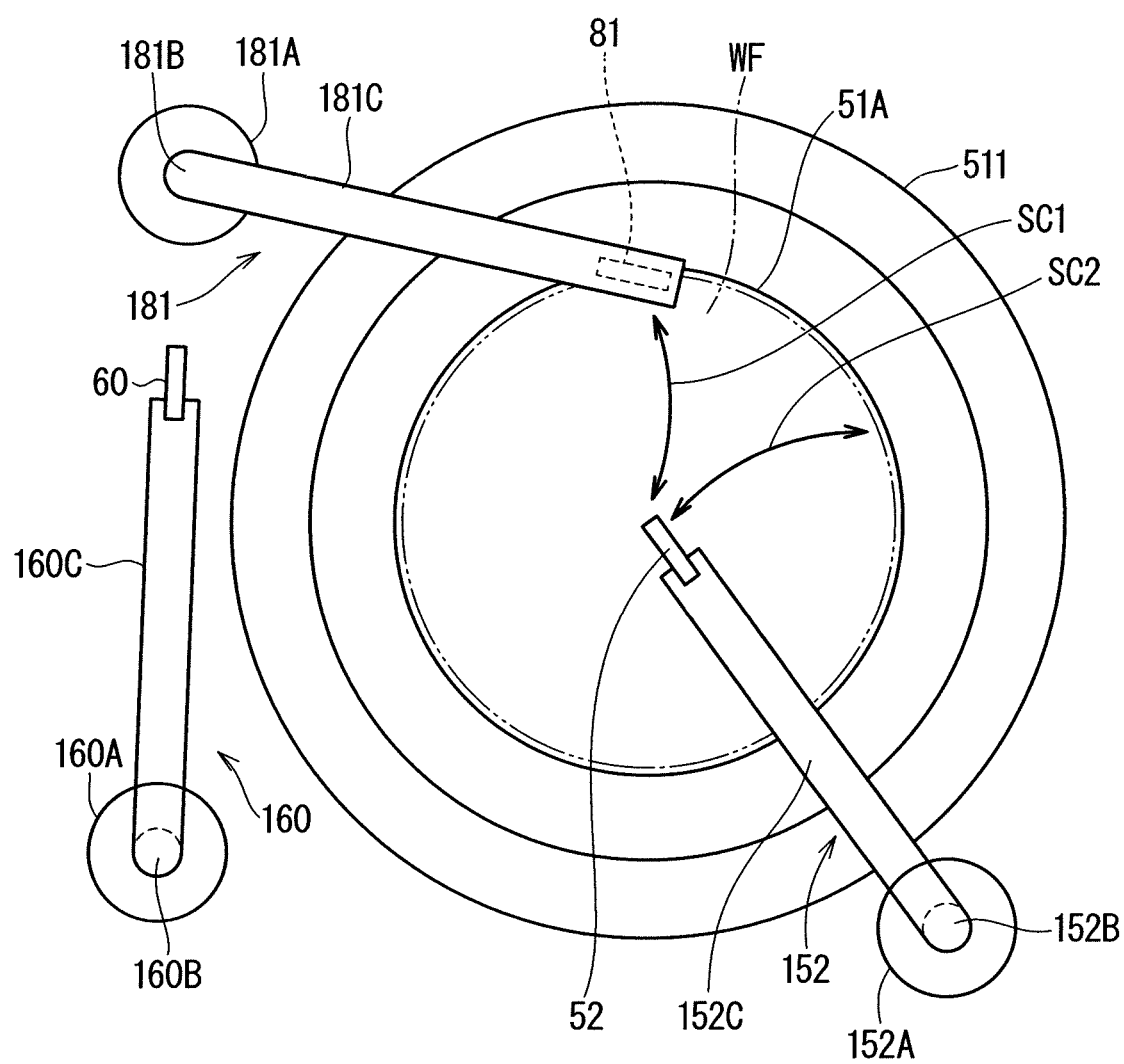
FIG. 3 is a plan view of a main part of the liquid processing unit in FIG. 2.

FIG. 3 is a plan view illustrating an example of the position of each arm in the liquid processing unit 34A. Each of the processing liquid arm 152, the rinse liquid arm 160, and the measurement arm 181 is movable in the radial direction (at least a direction having a radial component) of the spin base 51A, and can pass across the upper surface of the substrate WF rotating on the spin chuck 51.

FIG. 4 is a functional block diagram illustrating an example of the connection relationship between a control unit 7 and each of other elements in the substrate processing apparatus 1 (FIG. 1). The control unit 7 is connected with an operation unit (e.g., the processing liquid valve 56, the circulation valve 58, the rinse liquid valve 62, the shutter 50C, the spin motor 51D, or the like) of each liquid processing unit, a drive unit (e.g., a motor for reciprocation of the conveyance mechanism 31, or the like) that drives the conveyance mechanism 31, an operation unit (e.g., a motor for driving the articulated arm 23B, or the like) of the indexer robot 23, and an operation unit (e.g., the horizontal motor 133C, the rotation motor 133D, the vertical motor 133H, or the like) of the conveyance robot 33, and controls these units.

The hardware configuration of the control unit 7 is similar to that of a general computer. That is, the control unit 7 includes a central processing unit (i.e., CPU) 71 that performs various types of arithmetic processing, a read-only memory (i.e., ROM) 72 that is a read-only memory that stores a basic program, a random access memory (i.e., RAM) 73 that is a readable/writable memory configured to store various types of information, and a non-transitory storage unit 74 that stores a control application (program), data, or the like. The CPU 71, the ROM 72, the RAM 73, and the storage unit 74 are connected with each other by bus wiring 75 or the like. The control application or data may be provided to the control unit 7 in a state of being recorded on a non-transitory recording medium (e.g., a semiconductor memory, an optical medium, a magnetic medium, or the like). In this case, a reading apparatus that reads the control application or data from the recording medium is preferably connected with the bus wiring 75. Moreover, the control application or data may be provided from a server or the like to the control unit 7 via a network. In this case, a communication unit that performs network communication with an external apparatus is preferably connected with the bus wiring 75.

An input unit 76 and a display unit 77 are connected with the bus wiring 75. The input unit 76 includes various types of input devices such as a keyboard and a mouse. The operator inputs various types of information to the control unit 7 via the input unit 76. The display unit 77 includes a display device such as a liquid crystal monitor, and displays various types of information.

Figure 5:
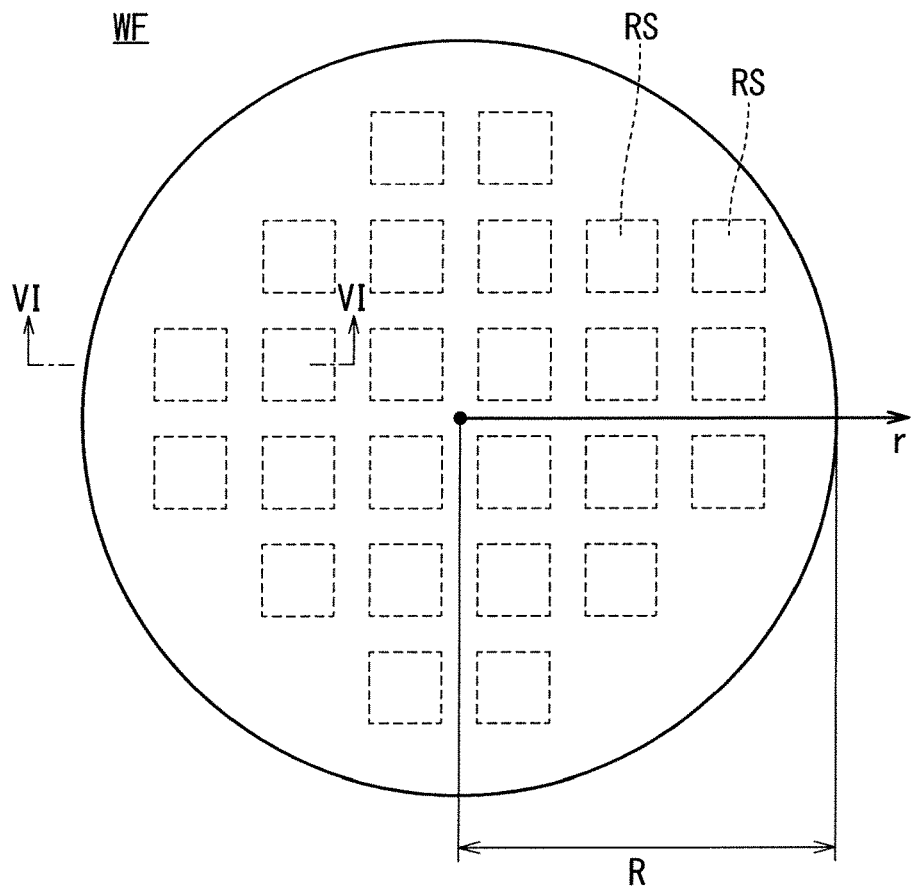
FIG. 5 is a plan view schematically illustrating an example of the configuration of a substrate to be processed by a substrate processing method.

FIG. 5 is a plan view schematically illustrating an example of the configuration of a substrate WF to be processed by a substrate processing method. The substrate processing method of the present embodiment is to process at least one substrate WF, and preferably to sequentially process a plurality of substrates WF by each liquid processing unit such as the liquid processing unit 34A described above. Each of the substrates WF has a circular shape having a radius R in the radial direction. Moreover, each of the substrates WF has a plurality of chip regions RS.

Figure 6:
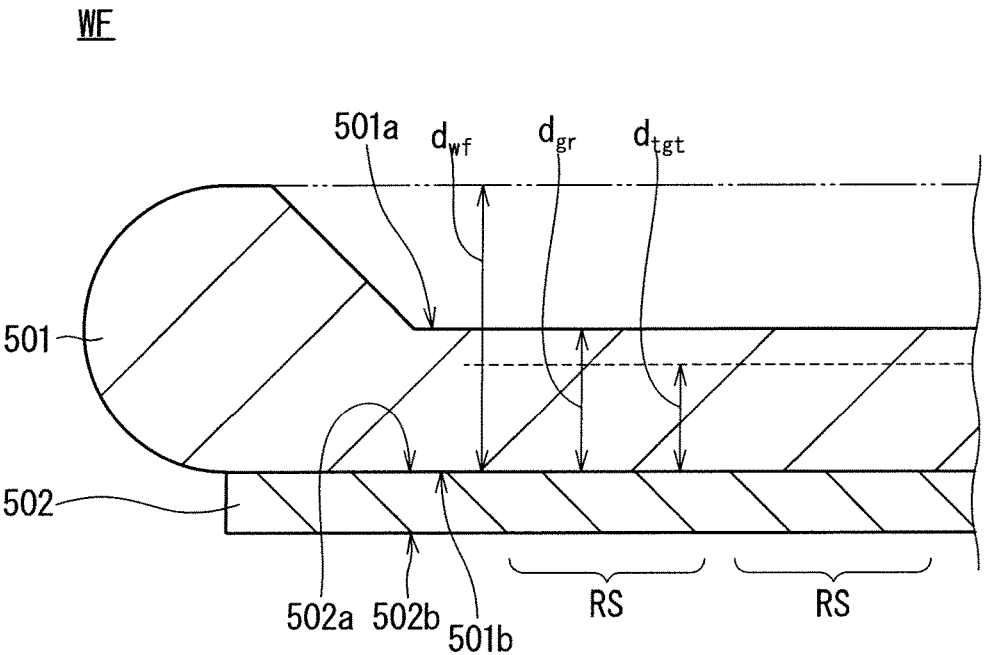
FIG. 6 is a schematic partial cross-sectional view taken along line VI-VI in FIG. 5.

FIG. 6 is a schematic partial cross-sectional view taken along line VI-VI in FIG. 5. The substrate WF has the to-be-processed film 501 and a device structure layer 502. The to-be-processed film 501 has a surface 501*a* and a surface 501*b* opposite thereto in the thickness direction (longitudinal direction in the figure). The device structure layer 502 has a surface 502*a* facing the surface 501*b*, and a surface 502*b* opposite thereto. The device structure layer 502 includes a semiconductor layer. The to-be-processed film 501 is typically a semiconductor substrate, for example, a silicon substrate. Each of the chip regions RS is provided with a structure serving as a semiconductor device. Note that the semiconductor device is obtained as a final product through several additional steps after the substrate processing method according to the present embodiment. These additional steps include a step of cutting out each chip region RS by dicing the substrate WF.

The to-be-processed film 501 may be formed by grinding a substrate having a thickness $d_{wf}$ (e.g., approximately 1 mm) to form a film having a thickness $d_{gr}$ (e.g., approximately 50 μm). Grinding is typically not applied to the edges of the substrate, in which case the substrate WF has a locally thick portion at the edges of the order of a few mm in width, as illustrated in FIG. 6. Hereinafter, this thick portion will be ignored in the description.

In the first embodiment, the semiconductor device is a vertical power device. A vertical power device typically has a pair of main electrodes (e.g., a source/drain electrode pair, an emitter/collector electrode pair, or an anode/cathode electrode pair). One of the pair of main electrodes is already provided on the surface 502b, and the other of the pair of main electrodes is formed on the surface 501a after the thickness of the to-be-processed film 501 is reduced from the thickness $d_{gr}$ to the thickness $d_{tgt}$ by the substrate processing method according to the present embodiment. Since the thickness $d_{tgt}$ is not excessively large, it is possible to avoid the electric resistance of the vertical power device from being excessively large. Moreover, since the thickness $d_{tgt}$ is not excessively small, it is possible to avoid shortage of the withstand voltage of the vertical power device. The semiconductor layer included in the device structure layer 502 may be an epitaxial layer formed on the to-be-processed film 501. The semiconductor layer and the epitaxial layer can be optically distinguished due to a difference in refractive index or the like.

Next, a substrate processing method according to the present embodiment will be described below with reference to FIGS. 7 to 9. Note that this substrate processing method is performed by the substrate processing apparatus 1 (FIG. 1). Specifically, this substrate processing method is performed in a state where the substrate WF housed in the substrate container 21 (FIG. 1) is conveyed into any one of the liquid processing units via the indexer robot 23, the conveyance mechanism 31, and the conveyance robot 33, and is further held by the spin chuck 51 (FIG. 2).

Figure 7:
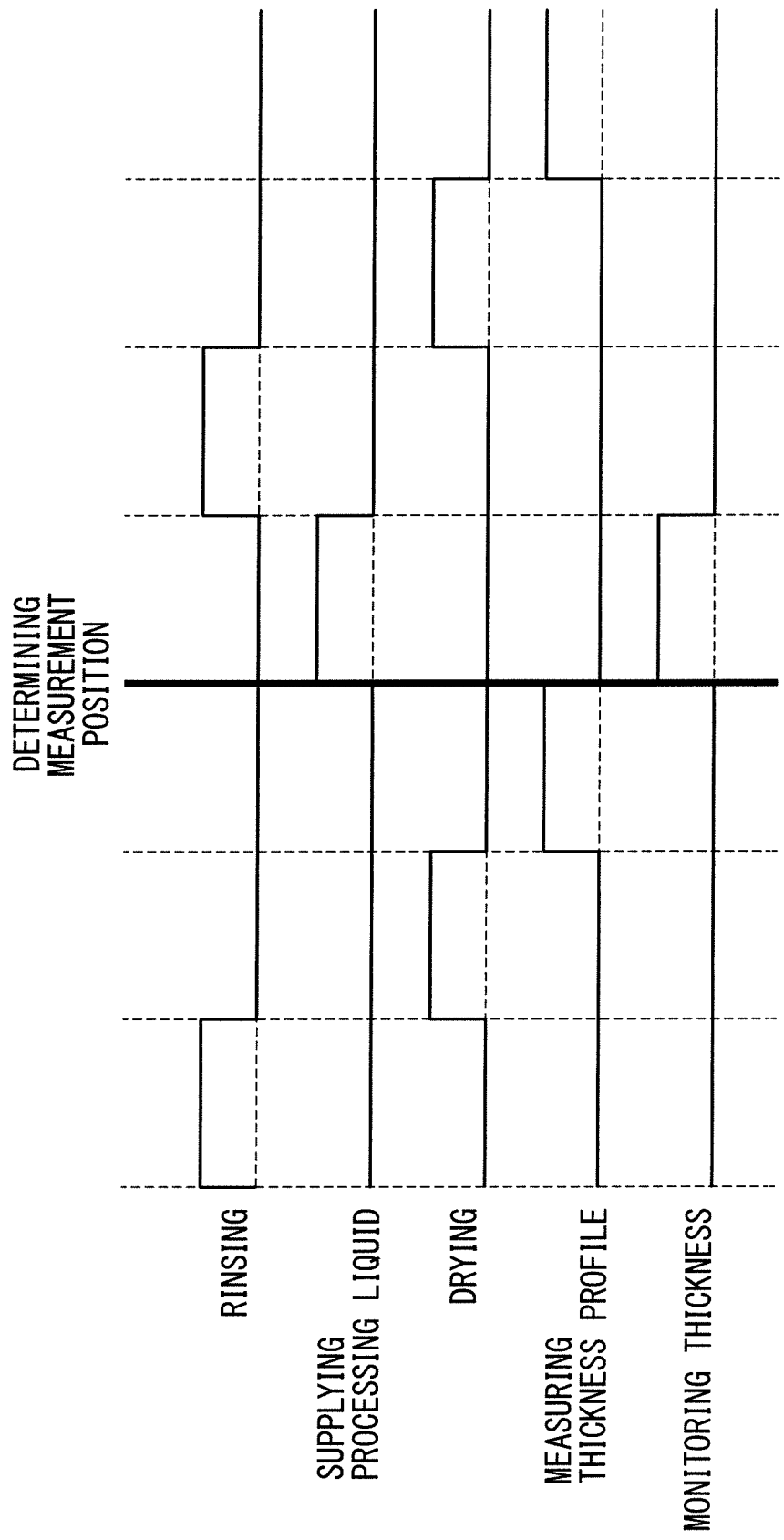
FIG. 7 is a sequence diagram illustrating an example of a substrate processing method according to the first embodiment.
Figure 8:
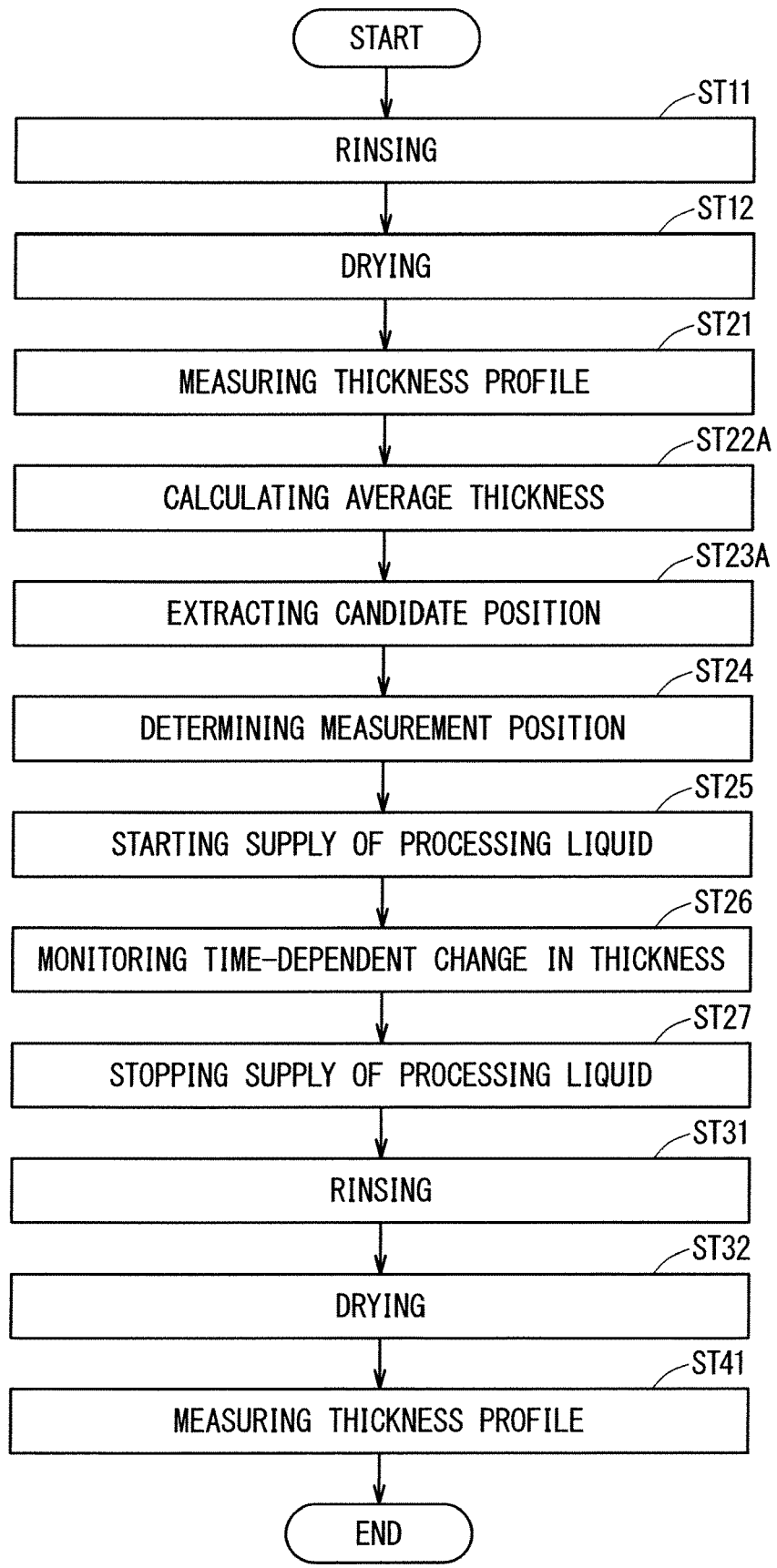
FIG. 8 is a flowchart corresponding to FIG. 7.
Figure 9:
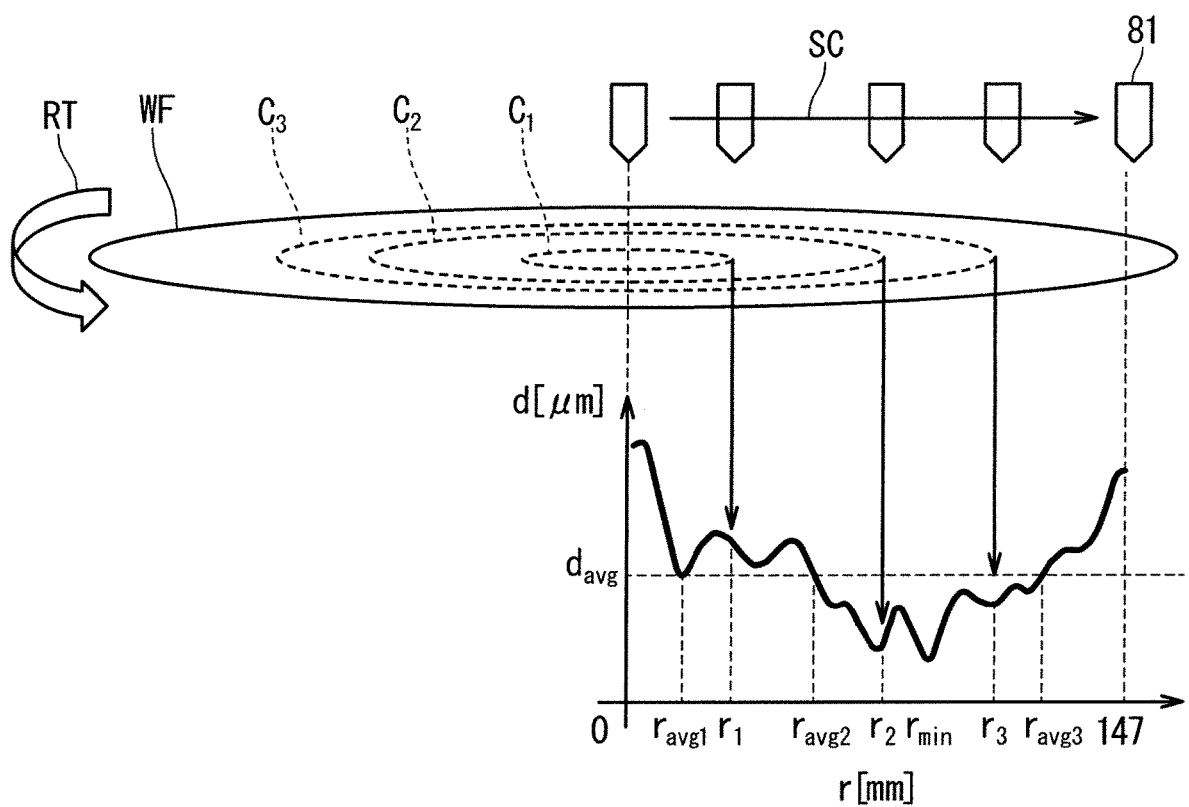
FIG. 9 is a schematic diagram for explaining an example of measurement of a thickness profile according to the first embodiment.

FIGS. 7 and 8 are respectively a sequence diagram and a flowchart illustrating an example of the substrate processing method according to the first embodiment.

First, rinsing is performed (FIG. 8: step ST11). In the rinsing, the rinse liquid is discharged from the rinse liquid nozzle 60 (FIG. 3) under the control of the control unit 7 (FIG. 4). Accordingly, extraneous substances and the like on the surface 501a (FIG. 6) of the substrate WF are washed away. As the rinse liquid, deionized water (DIW) or the like is used, for example.

Next, drying is performed (FIG. 8: step ST12). In the drying, isopropyl alcohol (IPA) or the like is supplied to the substrate WF under the control of the control unit 7, and then the spin base 51A is rotated to dry the substrate WF.

Next, the thickness profile of the to-be-processed film 501 in the radial direction is measured (FIG. 8: step ST21). Specifically, the thickness profile is measured by scanning with a sensor 81 in the radial direction while the substrate WF is rotated. The scanning with the sensor 81 is performed by rotating the arm portion 181C of the measurement arm 181 under the control of the control unit 7. FIG. 9 is a schematic diagram illustrating an example of the step ST21 described above. A profile of the thickness d with respect to the position r in the radial direction is obtained by the scan SC with the sensor 81. If the speed of the scan SC is sufficiently slower than the rotation speed of the substrate WF, a thickness profile depending on the radial direction is uniquely obtained. For example, when the position r of the sensor 81 in the radial direction is $r_1$, $r_2$, and $r_3$, the average value of the thicknesses of the to-be-processed film 501 at circumferences $C_1$, $C_2$, and $C_3$ is detected as the thickness d.

Next, arithmetic processing is performed by the control unit 7. First, the average thickness $d_{avg}$ is calculated from the thickness profile (FIG. 9) (FIG. 8: step ST22A). Next, at least one candidate position, which is to be particularly focused in thickness measurement to be described later, is extracted (FIG. 8: step ST23A). Specifically, at least one radial position r where the thickness profile has an average thickness $d_{avg}$ is extracted as at least one candidate position. In the example illustrated in FIG. 9, three positions $r_{avg1}$, $r_{avg2}$, and $r_{avg3}$ are extracted.

Next, a measurement position is determined (FIG. 8: step ST24). Specifically, at least one of the at least one candidate position (three candidate positions in the above example) is determined as at least one measurement position. Hereinafter, an example of the method will be described in detail.

Figure 10:
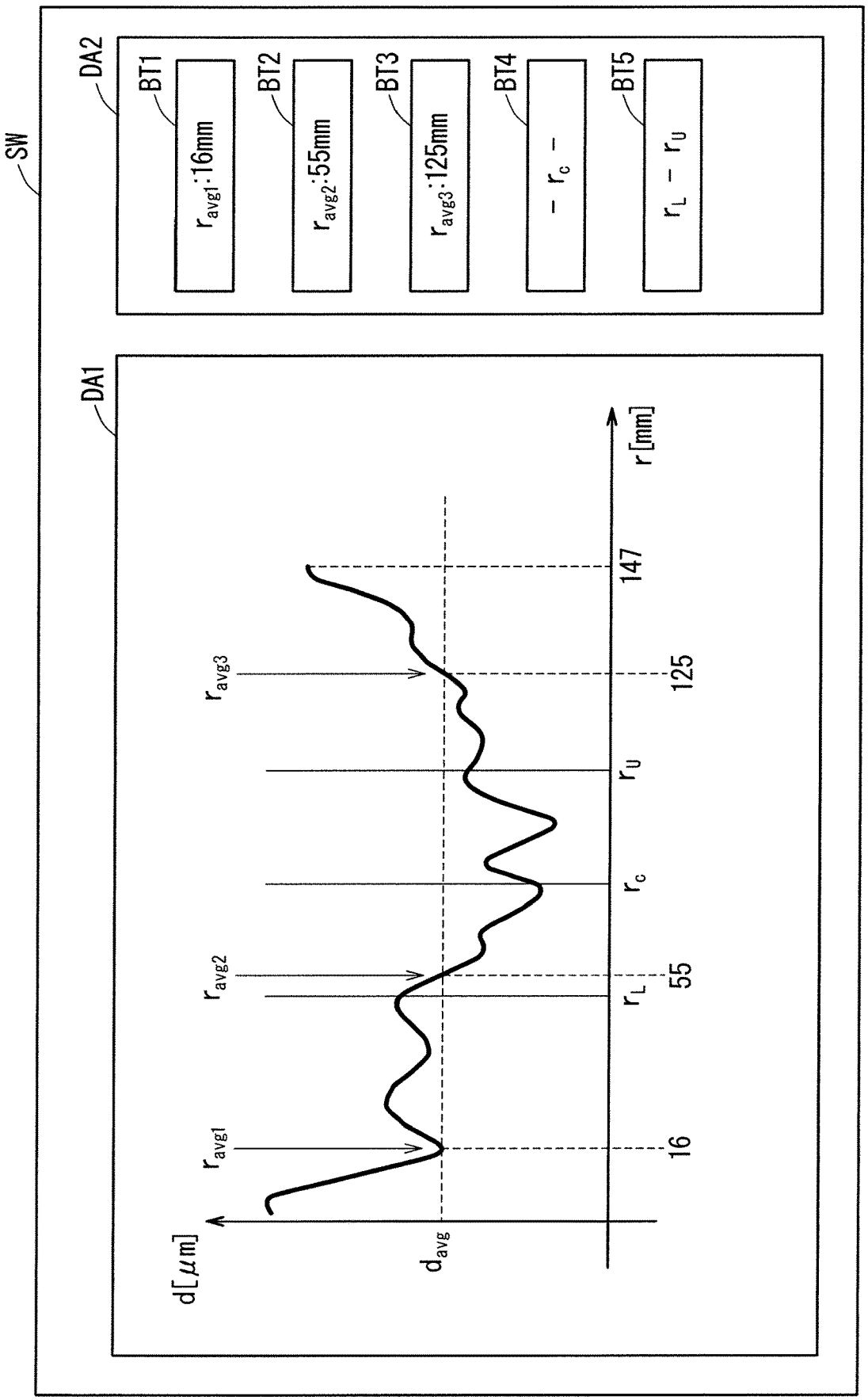
FIG. 10 is a diagram illustrating an example of a setting screen for setting a determination condition of a measurement position according to the first embodiment.

FIG. 10 is a diagram illustrating an example of a screen SW displayed by the display unit 77 (FIG. 4) to the operator in order to set a determination condition of the measurement position. The screen SW has a thickness profile window DA1 and a selection window DA2. The thickness profile window DA1 preferably displays the candidate positions described above in addition to the thickness profile. In the shown example, coordinates 16 mm, 55 mm, and 125 mm of the positions $r_{avg1}$, $r_{avg2}$, and $r_{avg3}$, respectively, are displayed. Moreover, the thickness profile window DA1 preferably displays the recommended lower limit $r_L$ and the recommended upper limit $r_U$. The recommended lower limit $r_L$ and the recommended upper limit $r_U$ are preset positive values, and satisfy $0<r_L<r_U<R$ with respect to the radius R of the substrate WF. Preferably, $R/3 \leq r_L < 2R/3$ and $R/3 < r_U \leq 2R/3$ is satisfied, and in FIG. 10, $r_L=R/3$ and $r_U=2R/3$ is satisfied. Note that the example in FIG. 10 corresponds to a case of R=150 mm approximately.

With respect to the position r, the range of $0 \leq r < R/3$ is a range in which the processing liquid becomes thick and the liquid level thereof is likely to be unstable when the processing liquid nozzle 52 is located in the vicinity of the center of the substrate WF, and is not suitable for highly accurate thickness measurement. On the other hand, in the range of $2R/3<r$, the thickness measurement is likely to be disturbed due to the influence of rotation of the substrate WF, and the measurement is particularly disturbed when the eccentricity of the rotation is large. Moreover, since the length of the circumference to be measured is large, the measured value is likely to vary.

The input unit 76 (FIG. 4) may accept an instruction as to which one of at least one candidate position (three candidate positions $r_{avg1}$, $r_{avg2}$, and $r_{avg3}$ in FIG. 10) is determined as at least one measurement position. Specifically, which of the buttons BT1 to BT5 of the selection window DA2 is selected by the operator may be accepted. The position $r_{avg1}$ is included in the measurement position in a case where the operator selects the button BT1, the position $r_{avg2}$ is included in the measurement position in a case where the operator selects the button BT2, and the position $r_{avg3}$ is included in the measurement position in a case where the operator selects the button BT3. In a case where the operator selects the button BT4, the candidate position closest to the recommended position $r_c$ among the plurality of candidate positions is selected as the measurement position. The recommended position $r_c$ is preferably equal to or larger than the recommended lower limit $r_L$ and equal to or smaller than the recommended upper limit $r_U$, and is, for example, an average value of the recommended lower limit $r_L$ and the recommended upper limit $r_U$. In the example in FIG. 10, when the button BT4 is selected, the position $r_{avg2}$ is determined as the measurement position as a result. When the operator selects the button BT5, the measurement position is limited to $r_L$ or more and $r_U$ or less. In the example in FIG. 10, when the button BT5 is selected, the position $r_{avg2}$ is determined as the measurement position as a result.

Although a case where an instruction from the operator is given in determining the measurement position has been described in the above description, note that the determination may be made by the control unit 7 without an instruction from the operator. Moreover, the number of measurement positions is any number of one or more. In a case where the number of measurement positions is plural, the thickness of each measurement position is monitored by appropriately moving the sensor 81 in the thickness time-dependent change monitor to be described later. The representative thickness calculated on the basis of the thicknesses at the plurality of measurement positions may be regarded as the thickness at the measurement position. The representative thickness is, for example, an average of thicknesses at a plurality of measurement positions. In a case where the number of measurement positions is one, the position of the sensor 81 in the thickness time-dependent change monitor to be described later may be fixed at the measurement position, or may deviate from the measurement position between intermittent monitors at the measurement positions.

Next, the supply of the processing liquid is started (FIG. 8: step ST25). Accordingly, processing liquid is supplied from the processing liquid nozzle 52 onto the to-be-processed film 501 of the substrate WF while the substrate WF is rotated. Accordingly, etching or the like is performed on the to-be-processed film 501 of the substrate WF. For example, a silicon film as the to-be-processed film 501 is etched using fluonitric acid which is a mixed liquid of hydrofluoric acid (HF) and nitric acid ($HNO_3$).

Next, when the processing liquid is supplied as described above, the time-dependent change in the thickness is monitored (FIG. 8: step ST26). Specifically, the sensor 81 monitors the time-dependent change in the thickness of the to-be-processed film 501 at the above-described at least one measurement position (e.g., position $r_{avg2}$ in FIG. 9) while the substrate WF is rotated.

When the processing liquid is supplied, periodic displacement SC2 (FIG. 3) in the radial direction is preferably given to the processing liquid nozzle 52. In addition, periodic displacement SC1 (FIG. 3) in the radial direction is preferably also given to the sensor 81. In this case, the timing at which the sensor 81 comes closest to the center of the substrate WF is different from the timing at which the processing liquid nozzle 52 comes closest to the center of the substrate WF. Preferably, the cycle of the displacement SC1 of the sensor 81 and the cycle of the displacement SC2 of the processing liquid nozzle 52 are the same cycle, and the timing at which the sensor 81 comes closest to the center of the substrate WF is the timing at which the processing liquid nozzle 52 comes farthest from the center of the substrate WF. Accordingly, a distance between the position where the processing liquid collides with the substrate WF and the position of the sensor 81 is easily secured. Thus, a distance is easily secured between the position where the liquid level of the processing liquid is unstable and the position of the sensor 81. As a result, the measurement by the sensor 81 can be performed stably.

Next, the supply of the processing liquid is stopped (FIG. 8: step ST27). Specifically, the supply of the processing liquid onto the surface of the substrate WF is stopped on the basis of the thickness of the to-be-processed film 501 in at least one measurement position (e.g., position $r_{avg2}$ in FIG. 9). An example of this specific method will be described later. Step ST27 is preferably performed so that the thickness of the to-be-processed film 501 is maintained at 20 μm or more, or more preferably 30 μm or more in at least one measurement position.

Next, rinsing is performed (FIG. 8: step ST31). Specifically, the rinse liquid is discharged from the rinse liquid nozzle 60 under the control of the control unit 7. Accordingly, the processing liquid and the like on the substrate WF are washed away. As the rinse liquid, deionized water (DIW) or the like is used, for example. Next, drying (FIG. 8: step ST32) is performed as in step ST12 described above. Next, the thickness profile may be measured again with the intention of confirming the result of the substrate processing (FIG. 8: step ST41).

As described above, the substrate processing of the first embodiment is performed.

Figure 11:
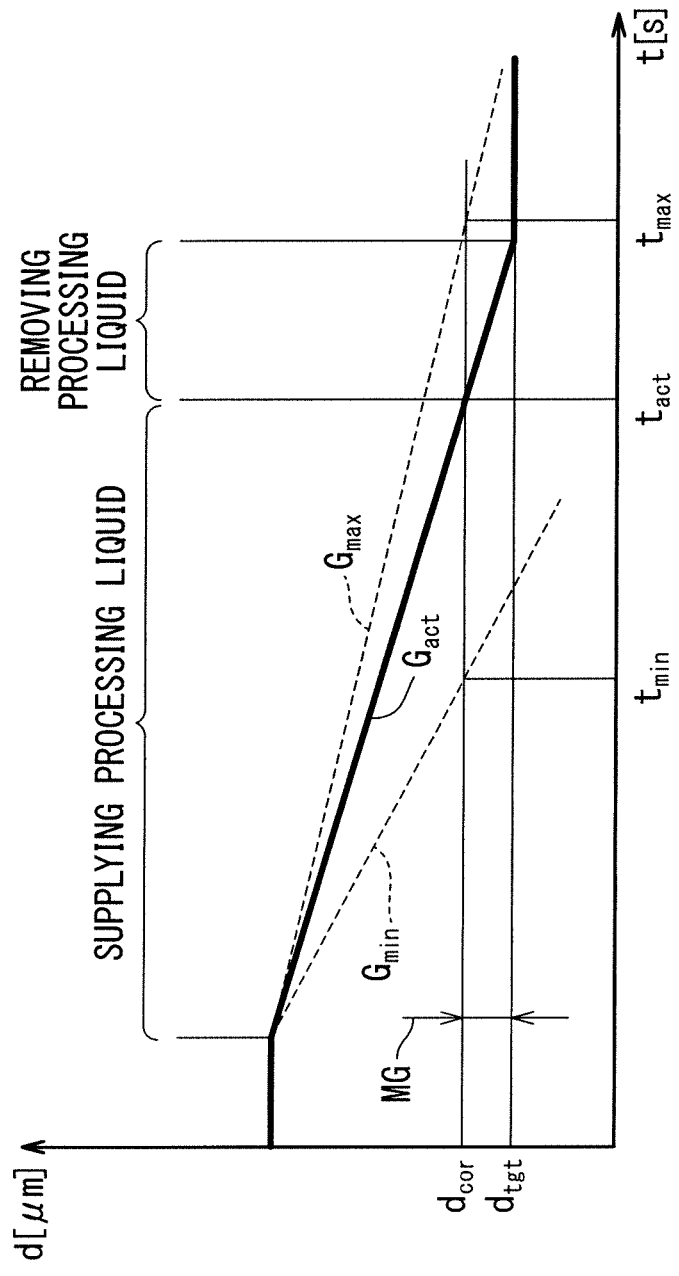
FIG. 11 is a graph for explaining an example of a method for determining the timing of stopping the supply of the processing liquid according to the first embodiment.

FIG. 11 is a graph for explaining an example of a method for determining the timing of stopping the supply of the processing liquid (step ST27 (FIG. 8)). In the drawing, a line $G_{act}$ is a detection value of the thickness d at the measurement position, and the supply of the processing liquid is stopped at time $t=t_{act}$ when $d=d_{cor}$ is satisfied. Here, $d_{cor}=d_{tgt}+MG$ is satisfied, the thickness $d_{tgt}$ is a target value, and the correction value MG is a preset correction thickness. Even if the supply of the processing liquid is stopped, a certain amount of time is required until the processing liquid is completely removed from the substrate WF, so that the progress of the substrate processing is not immediately stopped. The correction value MG is determined in consideration thereof, and is, for example, about approximately 1 to 2 μm.

As described above, the substrate processing method according to the present embodiment may sequentially process a plurality of substrates WF. In this case, after the first substrate WF is processed by the method illustrated in FIG. 8, the second substrate WF is processed by performing the method again. Here, the second substrate WF is a substrate to be processed immediately after the first substrate WF. At this time, at least a part of the processing liquid supplied from the processing liquid nozzle 52 onto the to-be-processed film 501 of the first substrate WF may be reused as processing liquid supplied from the processing liquid nozzle 52 onto the to-be-processed film 501 of the second substrate WF. Accordingly, the consumption amount of the processing liquid can be suppressed, while the time-dependent change in the characteristics of the processing liquid becomes non-negligible. Therefore, as in the present embodiment, it is more important to monitor the progress of the substrate processing method by the sensor 81 and adjust the processing conditions such as the processing time according to the result.

When the first substrate WF and the second substrate WF are processed as described above, the predicted range of the time-dependent change in the second substrate WF may be calculated as illustrated by the line Gmin and the line Gmax (FIG. 11) on the basis of the monitoring result of the time-dependent change in the first substrate WF (FIG. 8: step ST26). For example, the inclination of the line $G_{max}$ and the inclination of the line $G_{min}$ may be determined by multiplying the inclination of the line $G_{act}$ of the first substrate WF by a preset coefficient larger than 0 and smaller than 1 and a preset coefficient larger than 1, respectively. In that case, if the line $G_{act}$ of the second substrate WF deviates from the range between the line $G_{max}$ and the line $G_{min}$ at a predetermined timing (e.g., time $t=t_{act}$), the control unit 7 preferably issues a warning to the operator. Accordingly, it is possible to warn the operator that the progress speed of the substrate processing is significantly changed as compared with the preceding substrate processing. Moreover, the control unit 7 may not only issue a warning but also stop continuous processing of the substrates WF.

FIG. 12 is a graph for explaining a modification of measurement of a thickness profile according to the first embodiment. This modification is particularly preferable in a case where the structure to be a vertical power device provided in the chip region RS has a trench gate structure. Corresponding to the trench, the thickness profile of the to-be-processed film 501 has a locally small value, as shown. In order to exclude such a value from consideration in the subsequent arithmetic processing, only a thickness within a preset allowable range based on the estimated thickness (100 μm in the example in FIG. 12) is used for the thickness profile in this modification. In other words, only the thickness within the preset allowable range in the thickness profile is used for the subsequent arithmetic processing (step ST22A in FIG. 13 in the present embodiment). The information of the estimated thickness may be accepted from the input unit 76. The allowable range is, for example, ±2% based on the estimated thickness, and is 98 μm or more and 102 μm or less in the example in FIG. 12.

Second Embodiment

In the second embodiment, a structure to be a semiconductor device is also provided in each of the chip regions RS (FIGS. 5 and 6) as in the first embodiment described above. However, in the second embodiment, the semiconductor device is a non-power device (e.g., any of an image sensor device, a memory device, and a logic device) unlike the first embodiment. The to-be-processed film 501 (FIG. 6) is necessary in the manufacturing process of these non-power devices, but is unnecessary as a final product (e.g., a base substrate to be used to temporarily support a device structure finally required). Therefore, the to-be-processed film 501 is preferably removed as much as possible by the substrate processing method according to the present embodiment. The semiconductor device can be downsized by removing the to-be-processed film 501. Especially, when the light receiving surface of the image sensor device is the surface 502*a* (FIG. 6), since the to-be-processed film 501 blocks the optical path, removal thereof is important in securing sensitivity. On the other hand, when the substrate processing progresses excessively, there is a concern about a harmful effect on the characteristics of the semiconductor device due to unintentional erosion of the device structure layer 502 (FIG. 6) covered with the to-be-processed film 501. Therefore, by managing the minimum thickness $d_{min}$ of the to-be-processed film 501, the above-described erosion can be suppressed. Preferably, the minimum thickness $d_{min}$ is usually not reduced to zero, in order to sufficiently prevent erosion. However, in a case where the surface 502*a* of the device structure layer 502 is protected by an etching stop film (e.g., a silicon nitride film), it is relatively easy to reduce the minimum thickness $d_{min}$ to zero.

The average thickness $d_{avg}$ (FIG. 9) is managed in the first embodiment described above in the substrate processing method, while the minimum thickness $d_{min}$ of the to-be-processed film 501 is managed for the above reason in the second embodiment. Hereinafter, differences from the substrate processing method according to the first embodiment will be mainly described.

Figure 13:
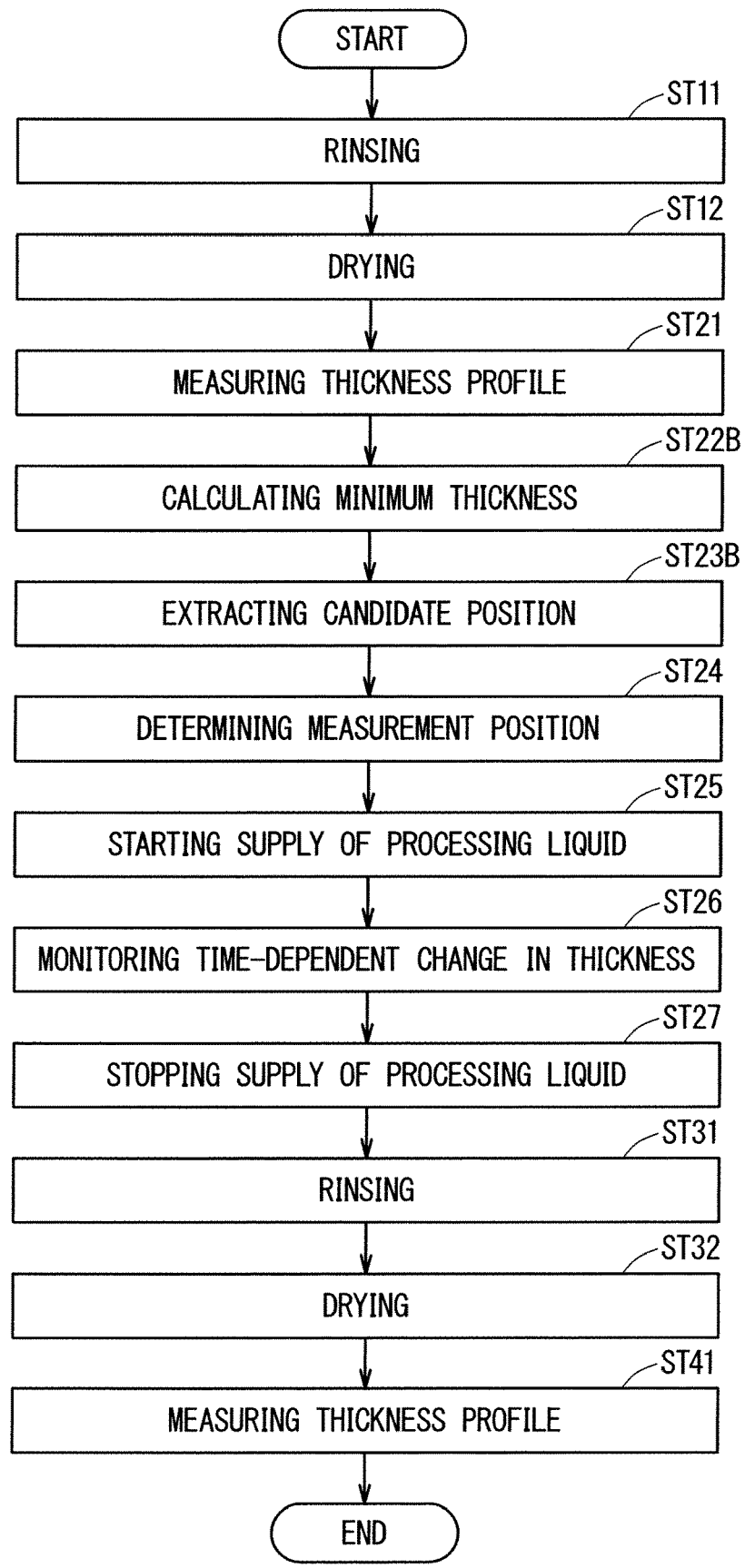
FIG. 13 is a flowchart illustrating an example of a substrate processing method according to a second embodiment.

FIG. 13 is a flowchart illustrating an example of a substrate processing method according to the second embodiment. Steps up to step ST21 are similar to those in the first embodiment.

Figure 14:
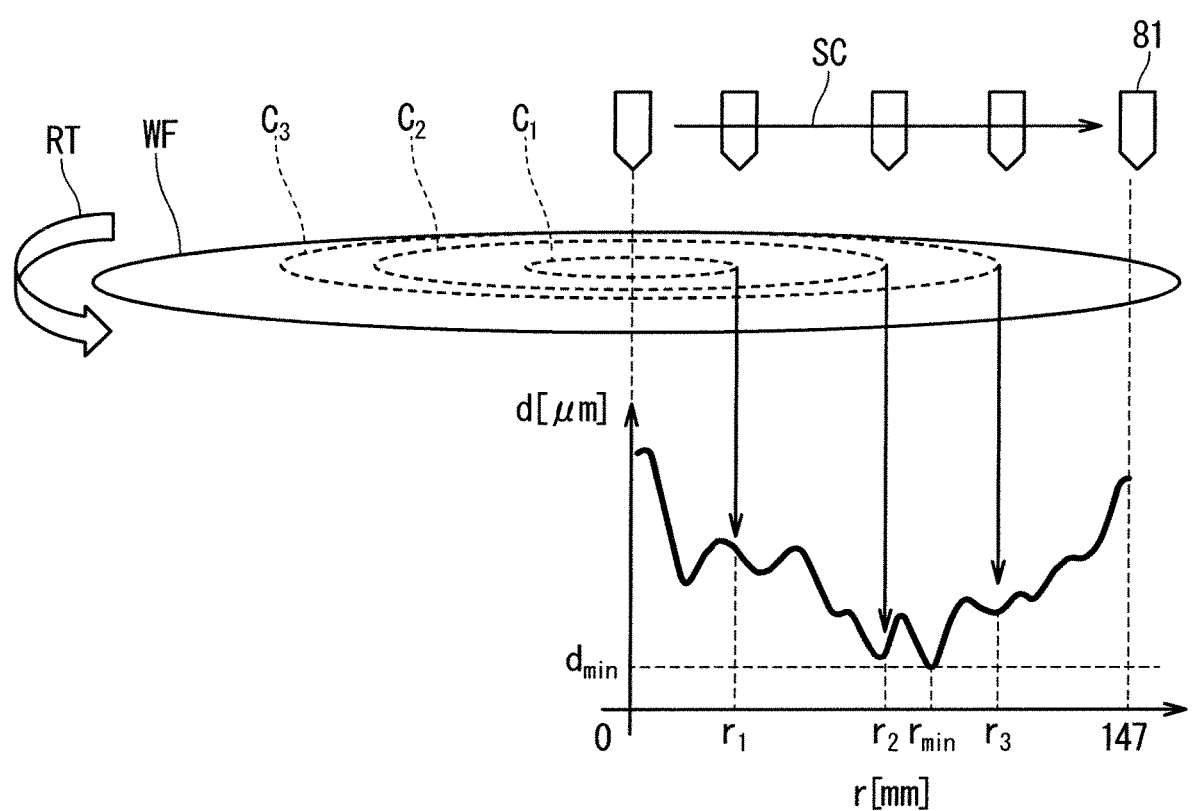
FIG. 14 is a schematic diagram for explaining an example of measurement of a thickness profile according to the second embodiment.

Next, arithmetic processing is performed by the control unit 7. Specifically, first, the minimum thickness $d_{min}$ is calculated from the thickness profile (FIG. 14) (FIG. 13: step ST22B). Next, at least one candidate position, which is to be particularly focused in thickness measurement, is extracted (FIG. 8: step ST23B). Specifically, at least one radial position r where the thickness profile has a minimum thickness $d_{min}$ is extracted as at least one candidate position. In the example illustrated in FIG. 14, one position $r_{min}$ is extracted.

Next, a measurement position is determined (FIG. 8: step ST24). Specifically, at least one of the at least one candidate position is determined as at least one measurement position. In the example in FIG. 14, since only one candidate position $r_{min}$ is extracted, this is directly determined as a measurement position. Note that there is a possibility that a plurality of candidate positions is extracted depending on a significant figure(s) of the thickness d and the like, and in that case, at least one measurement position may be appropriately selected from among them by a method similar to the method described in the first embodiment. Next, as in the first embodiment, the supply of the processing liquid is started (FIG. 8: step ST25), and the time-dependent change in the thickness is monitored (FIG. 8: step ST26).

Next, the supply of the processing liquid is stopped (FIG. 8: step ST27). Specifically, the supply of the processing liquid onto the surface of the substrate WF is stopped on the basis of the thickness of the to-be-processed film 501 in at least one measurement position (position $r_{min}$ in the example in FIG. 14). Step ST27 is preferably performed such that the thickness of the to-be-processed film 501 is reduced to 10 μm or less in at least one measurement position, and is reduced to, for example, approximately 4 μm. Note that the timing of stopping the supply of the processing liquid may be determined by a method similar to the method described in the first embodiment with reference to FIG. 11.

Thereafter, the substrate processing according to the present embodiment is performed by performing steps ST31, 32, and S41 as in the first embodiment. Note that the features other than those particularly described above are substantially the same as those of the first embodiment described above, and thus the description thereof will not be repeated.

Note that, although both the first embodiment and the second embodiment can be carried out according to the sequence illustrated in FIG. 7, the substrate processing method according to the present invention is not limited to this sequence. For example, as illustrated in FIG. 15, the measurement of the thickness profile may be performed during the rinsing, thereby reducing the processing time.

Although material qualities, materials, dimensions, shapes, relative arrangement relationships, implementation conditions, and the like of the respective components may also be described in the embodiments described above, these are each one example in all aspects, and are not limited to those described herein. Consequently, numerous modifications and equivalents, examples of which are not illustrated, are supposed within the scope of the technology disclosed herein. For example, a case of deforming, adding, or omitting at least one component is included.

Moreover, each component described in the embodiments described above is supposed as software or firmware, or hardware corresponding thereto, and in both concepts, each component is referred to as a "unit" or a "processing circuit" (circuitry).

EXPLANATION OF REFERENCE SIGNS

1: substrate processing apparatus
7: control unit
34A: liquid processing unit
52: processing liquid nozzle
76: input unit
77: display unit
81: sensor
501: to-be-processed film
502: device structure layer
511: processing liquid recovery guard
513: liquid discharge port
RS: chip region
WF: substrate

The invention claimed is:

1. A substrate processing method for processing at least one substrate that has a radial direction, has a plurality of chip regions each being provided with a structure to be a power device, and is provided with a to-be-processed film, the substrate processing method comprising steps of:
   (a) obtaining a thickness profile of said to-be-processed film in said radial direction by scanning with a sensor in said radial direction while rotating said substrate;
   (b) calculating an average thickness of said to-be-processed film from said thickness profile;
   (c) identifying at least one radial position of said to-be-processed film as at least one candidate position by using said thickness profile to identify said at least one radial position at which said to-be-processed film has said average thickness calculated in said step (b);
   (d) selecting at least one measurement position from said at least one candidate position;
   (e) supplying processing liquid from a nozzle onto said to-be-processed film of said substrate while rotating said substrate; and
   (f) monitoring a time-dependent change in a thickness of said to-be-processed film at said at least one measurement position by said sensor while rotating said substrate.

2. The substrate processing method according to claim 1, further comprising a step of
   (g) stopping supply of processing liquid onto a surface of said substrate on a basis of said thickness of said to-be-processed film at said at least one measurement position.

3. The substrate processing method according to claim 2, wherein said step (g) is performed so that said thickness of said to-be-processed film is maintained at 20 μm or more at said at least one measurement position.

4. The substrate processing method according to claim 1, wherein
   periodic displacement in said radial direction is given to said nozzle in said step (e), and
   periodic displacement in said radial direction is given to said sensor in said step (f), and timing at which said sensor comes closest to a center of said substrate is different from timing at which said nozzle comes closest to said center of said substrate.

5. The substrate processing method according to claim 1, wherein
   said at least one substrate includes a first substrate and a second substrate, and said substrate processing method is a substrate processing method of processing said first substrate by performing said steps (a) to (f) and then processing said second substrate by performing said steps (a) to (f) again, and
   at least a part of said processing liquid in said step (e) for said first substrate is reused as said processing liquid in said step (e) for said second substrate.

6. The substrate processing method according to claim 5, wherein
   said second substrate is a substrate to be processed immediately after said first substrate, and
   the substrate processing method further comprises a step of calculating a predicted range of said time-dependent change in said step (f) for said second substrate on a basis of a result of said step (f) for said first substrate.

7. The substrate processing method according to claim 1, wherein
   said substrate has a radius R, and
   in said step (d), positive values $r_L$ and $r_U$ satisfying $0 < r_L < r_U < R$ have been preset and said at least one measurement position is selected from said at least one candidate position located within a range of $r_L$ or more and $r_U$ or less from a center of said substrate.

8. The substrate processing method according to claim 1, wherein
   said step (d) includes steps of:
   (d1) displaying said at least one candidate position; and
   (d2) accepting an instruction as to which of said at least one candidate position is determined to be said at least one measurement position.

9. The substrate processing method according to claim 1, wherein
   said step (a) includes a step of:
   (a1) accepting information on an estimated thickness of said to-be-processed film, and
   in said step (a), only a thickness within a predetermined allowable range based on said estimated thickness is used for said thickness profile.

10. The substrate processing method according to claim 9, wherein said power device has a trench gate structure.

11. A substrate processing method for processing at least one substrate that has a radial direction, has a plurality of chip regions each being provided with a structure to be a semiconductor device that is a non-power device, and is provided with a to-be-processed film, the substrate processing method comprising steps of:
   (a) obtaining a thickness profile of said to-be-processed film in said radial direction by scanning with a sensor in said radial direction while rotating said substrate;
   (b) calculating a minimum thickness of said to-be-processed film from said thickness profile;
   (c) identifying at least one radial position of said to-be-processed film as at least one candidate position by using said thickness profile to identify said at least one radial position at which said to-be-processed film has said minimum thickness calculated in said step (b);
   (d) selecting at least one measurement position from said at least one candidate position;
   (e) supplying processing liquid from a nozzle onto said to-be-processed film of said substrate while rotating said substrate; and
   (f) monitoring a time-dependent change in a thickness of said to-be-processed film at said at least one measurement position by said sensor while rotating said substrate.

12. The substrate processing method according to claim 11, further comprising a step of (g) stopping supply of processing liquid onto a surface of said substrate on a basis of said thickness of said to-be-processed film at said at least one measurement position.

13. The substrate processing method according to claim 12, wherein said step (g) is performed so that said thickness of said to-be-processed film is reduced to 10 μm or less at said at least one measurement position.

14. The substrate processing method according to claim 11, wherein
periodic displacement in said radial direction is given to said nozzle in said step (e), and
periodic displacement in said radial direction is given to said sensor in said step (f), and timing at which said sensor comes closest to a center of said substrate is different from timing at which said nozzle comes closest to said center of said substrate.

15. The substrate processing method according to claim 11, wherein
said at least one substrate includes a first substrate and a second substrate, and said substrate processing method is a substrate processing method of processing said first substrate by performing said steps (a) to (f) and then processing said second substrate by performing said steps (a) to (f) again, and
at least a part of said processing liquid in said step (e) for said first substrate is reused as said processing liquid in said step (e) for said second substrate.

16. The substrate processing method according to claim 15, wherein
said second substrate is a substrate to be processed immediately after said first substrate, and
the substrate processing method further comprises a step of calculating a predicted range of said time-dependent change in said step (f) for said second substrate on a basis of a result of said step (f) for said first substrate.

17. The substrate processing method according to claim 11, wherein
said substrate has a radius R, and
in said step (d), positive values $r_L$ and $r_U$ satisfying $0 < r_L < r_U < R$ have been preset and said at least one measurement position is selected from said at least one candidate position located within a range of $r_L$ or more and $r_U$ or less from a center of said substrate.

18. The substrate processing method according to claim 11, wherein
said step (d) includes steps of:
(d1) displaying said at least one candidate position; and
(d2) accepting an instruction as to which of said at least one candidate position is determined to be said at least one measurement position.

19. The substrate processing method according to claim 11, wherein said semiconductor device is any one of an image sensor device, a memory device, or a logic device.

* * * * *